(12) United States Patent
Ting et al.

(10) Patent No.: US 6,515,929 B1
(45) Date of Patent: Feb. 4, 2003

(54) PARTIAL REFRESH FEATURE IN PSEUDO SRAM

(75) Inventors: Tah-Kang Joseph Ting, Hsinchu (TW); Steven Li, Taiwan (TW)

(73) Assignee: Etron Technology, Inc., Hsin-Chu (TW)

( * ) Notice: Subject to any disclaimer, the term of this patent is extended or adjusted under 35 U.S.C. 154(b) by 0 days.

(21) Appl. No.: 10/050,433

(22) Filed: Jan. 16, 2002

Related U.S. Application Data

(60) Provisional application No. 60/338,262, filed on Oct. 29, 2001.

(51) Int. Cl.[7] .................................................. G11C 7/00
(52) U.S. Cl. .................. 365/222; 365/226; 365/189.01
(58) Field of Search ................................. 365/222, 226, 365/189.01, 189.05, 230.08

(56) References Cited

U.S. PATENT DOCUMENTS 5,278,797 A * 1/1994 Jeon et al. ............. 365/189.07
5,333,128 A * 7/1994 Yoon et al. .................. 365/222
5,724,295 A    3/1998 Beiley et al. ................ 365/222
6,094,705 A    7/2000 Song ........................... 711/106
6,154,409 A * 11/2000 Huang et al. ................ 365/194
6,311,280 B1  10/2001 Vishin ......................... 713/320

* cited by examiner

Primary Examiner—David Lam
(74) Attorney, Agent, or Firm—George O. Saile; Stephen B. Ackerman; Douglas R. Schnabel

(57) ABSTRACT

A pseudo SRAM integrated circuit device is achieved. The device comprises, first, a memory array comprising a plurality of dynamic storage cells. Finally, an access controller is included. The access controller provides read and write access to the memory array from an external device. The access controller performance is compatible with a standard SRAM memory device. The access controller enables a partial data retention mode comprising selective refreshing of at least one part of the memory array and non-refreshing of at least one other part of the memory array.

20 Claims, 3 Drawing Sheets

PARTIAL REFRESH FEATURE IN PSEUDO SRAM

The instant application claims priority to U.S. Provisional Application Ser. No. 60/338,262, field Oct. 29, 2001, which is herein incorporated by reference.

BACKGROUND OF THE INVENTION

(1) Field of the Invention

The invention relates to a pseudo SRAM, that is, a device having an interface that is compatible with a standard SRAM coupled with a memory array comprising dynamic memory cells, and, more particularly, to a pseudo SRAM integrated circuit a device having a partial data retention mode.

(2) Description of the Prior Art

Dynamic or DRAM memory devices use an array of memory cells with each cell typically comprising a single access transistor and a capacitor. By comparison, static or SRAM memory devices use an array of memory cells with each cell comprising multiple transistor cells, typically made up of 4 or 6 transistors. For this reason, DRAM memory devices are significantly smaller, and therefore less expensive, than SRAM devices for the same memory capacity. However, SRAM devices have lower current consumption since the DRAM cell capacitors must be frequently refreshed to hold their memory state. For example, a SRAM device having a memory capacity of 4 MB or 8 MB, will have a standby current, $I_{stdby}$, of between about 20 $\mu$A and 30 $\mu$A. By comparison, a 16 MB or 32 MB memory based on dynamic memory cells will have an $I_{stdby}$ of between about 100 $\mu$A and 150 $\mu$A. This is too much current drain for many battery-based systems.

It remains desirable, however, from a cost reduction standpoint, to use DRAM memory devices rather than SRAM devices. For example, it is desirable to replace the low power SRAM in a portable electronics system or cell phone with a DRAM to reduce chip or system size and cost. To facilitate the substitution of DRAM for SRAM, with minimal impact on performance, the DRAM device must overcome two problems. First, the external access operations on the DRAM must be made compatible with those of a standard SRAM, and particularly the asynchronous SRAM, with very predictable results. Second, the current consumption problem must be minimized.

Referring now to FIG. 1, a prior art pseudo SRAM device 10 is illustrated in schematic form. In this prior art device, a SRAM compatible access control circuit 20 is used to access data from a static memory cell array 24 and a dynamic memory cell array 28. By incorporating both types of memory cell arrays 24 and 28, this approach gains part of the benefit of the lower integration cost of dynamic cells and part of the benefit of the lower standby current of static cells. In a typical arrangement, the dynamic array 28 is made substantially larger and is used to execute the bulk of active mode memory transactions. The static array 24 is made smaller and is used to hold data that must be maintained during a low-power mode condition.

In this configuration, the refresh controller 32 is used to refresh all of the cells in the dynamic memory array on a periodic basis to prevent memory state loss. This type of pseudo SRAM device may also have a power saving mode where the refresh controller 32 is turned OFF. In this state, all of the data in the dynamic array 28 is lost. Only data in the static array 24 is retained. A significant disadvantage of the prior art pseudo SRAM is the need for a static cell array 24 for the power saving mode. This static array 24 is not cost effective for the integrated circuit layout due to the larger cell size when compared to the dynamic cells. The inability to retain any data in the dynamic array also presents a serious application and programming limitation.

Several prior art inventions relate to refresh control for a DRAM device. U.S. Pat. 6,094,705 to Song describes a method and a system to reduce power consumption in a DRAM using selective refresh. The method uses valid bits associated with a row of the memory device to indicate if a refresh is required for that row. The method is not compatible with a standard SRAM, or pseudo SRAM, circuit. U.S. Pat. 5,724,295 to Beiley et al discloses a DRAM circuit to disable or to enable refresh for partitions of the DRAM memory array when redundant circuits are allocated. U.S. Pat. 6,311,280 to Vishin teaches a low power memory system for a portable digital radio. DRAM data rows may be selectively refreshed or not refreshed to save power.

SUMMARY OF THE INVENTION

A principal object of the present invention is to provide an effective and very manufacturable pseudo SRAM circuit.

A further object of the present invention is to provide a pseudo SRAM circuit comprising a SRAM compatible access controller and a dynamic memory array where the standby current consumption is reduced.

Another further object of the present invention is to provide a reduced standby current consumption pseudo SRAM device while providing partial data retention capability in the dynamic cell array.

Another further object of the present invention is to provide the increased flexibility of two power saving modes, one with partial data retention and one with no data retention.

Another further object of the present invention is to provide a circuit that is compatible with a dynamic memory only or a mixed, dynamic and static memory.

In accordance with the objects of this invention, a pseudo SRAM integrated circuit device is achieved. The device comprises, first, a memory array comprising a plurality of dynamic storage cells. In addition, an access controller is included. The access controller provides read and write access to the memory array from an external device. The access controller performance is compatible with a standard SRAM memory device. The access controller enables a partial data retention mode comprising selective refreshing of at least one part of the memory array and non-refreshing of at least one other part of the memory array.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a pseudo SRAM integrated circuit device. A partial data retention (PDR), power saving mode is disclosed. It should be clear to those experienced in the art that the present invention can be applied and extended without deviating from the scope of the present invention.

Figure 1:
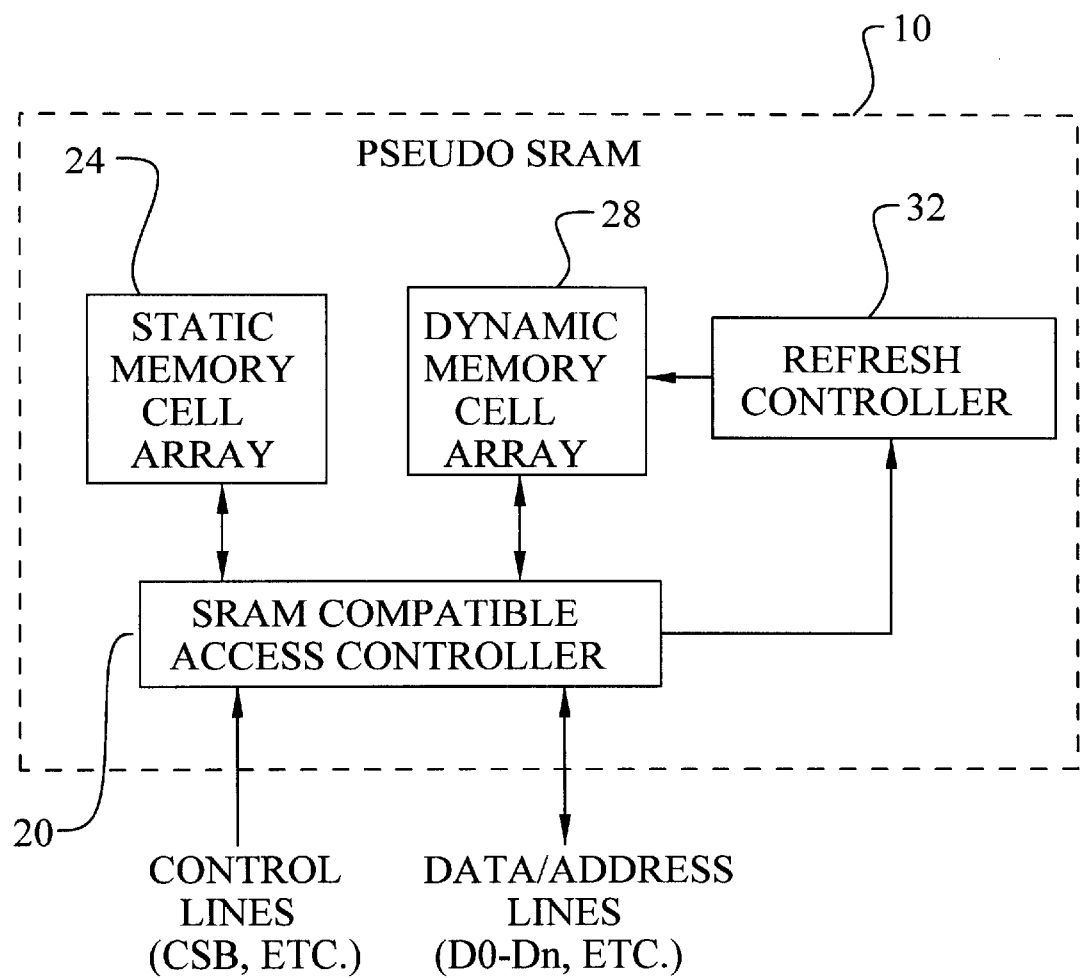
FIG. 1 illustrates a prior art example of a pseudo SRAM integrated circuit device with a SRAM compatible access controller, a static memory cell array (SRAM), and a dynamic memory cell array (DRAM).
Figure 2:
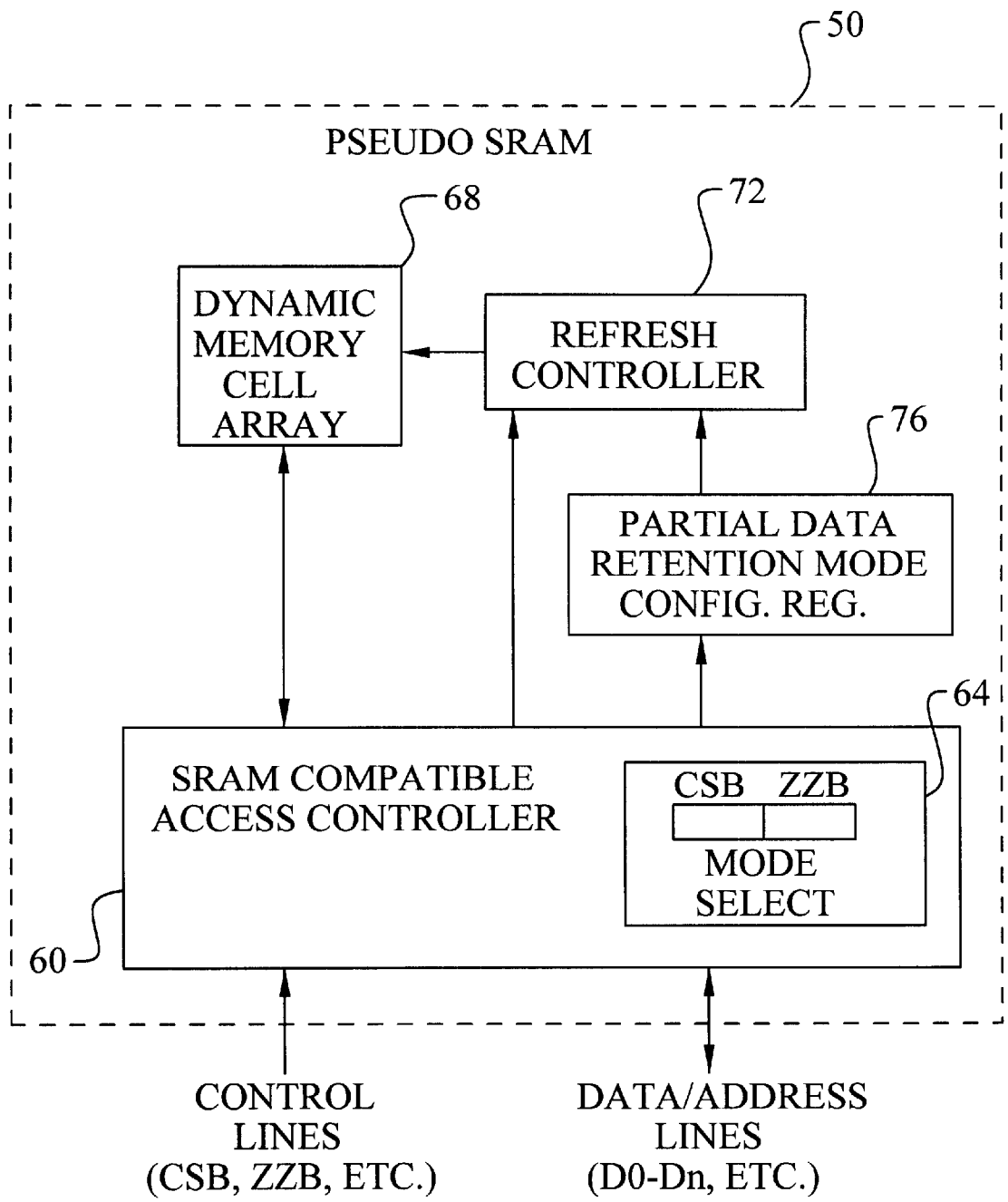
FIG. 2 illustrates the preferred embodiment of the present invention pseudo SRAM integrated circuit device comprising a SRAM compatible access controller and a dynamic memory cell array (DRAM) where a partial data retention (PDR) mode is included.

Referring now to FIG. 2, the preferred embodiment of the circuit of the present invention is shown. A pseudo SRAM integrated circuit 50 with a novel partial data retention (PDR) feature is shown. Several important features of the present invention are shown in the illustration and are further described below. The pseudo SRAM device 50 device comprises, first, a memory array 68 comprising a plurality of dynamic storage cells. The dynamic memory array 68 further comprises row and column decoding circuits, sensing circuits, and other supporting circuits that are well known in the art. The dynamic array cells may comprise any of the cell designs and types well known in the art, and, most preferably, comprise single transistor cells.

An access controller 60 is included. This access controller 60 is broadly defined as the sum of the circuit elements that facilitate access from an external device, such as a microprocessor, to the internal dynamic memory array 68. In practice, the access control may comprise a multiplicity of blocks and sub-blocks that may be partitioned in variety of ways. Generally, the access controller 60 provides read and write access to the memory array 68. from an external device, such as a microprocessor. As an important feature, the access controller 60 performance must be compatible with the performance of a standard SRAM memory device. In other words, the input/output (I/O) physical configuration, control line definitions, and read/write (R/W) access procedures are consistent and compatible with the standard SRAM memory device definitions well known in the art.

As a most important feature of the present invention, the access controller 60 enables a partial data retention (PDR) mode. The PDR mode is defined as the selective refreshing of at least one part of the memory array 68 and the non-refreshing of at least one other part of the memory array 68. The parts, or blocks, within the memory array 68 that are refreshed will maintain valid data states. However, those blocks that are not refreshed will become invalid.

The refresh controller 72 enables the refresh function for the memory array 68. The refresh controller 72 is a technology known to the art wherein the data state of a cell within the array 68 is sensed, or read, and then this state is refreshed, or re-written, to the cell. This process is repeated for each cell in the array 68 on a periodic basis to retain valid data. As an important feature of the present invention, the refresh controller 72 must be capable of at least two states of operation. In the first state, the refresh controller 72 periodically refreshes all of the blocks within the memory array 68 without selectivity. In the second state, the refresh controller 72 performs a selective refresh of only particular blocks within the memory array 68. This second state is the partial data retention (PDR) mode that is a most important feature of the present invention.

In the preferred embodiment of the pseudo SRAM device 50 of the present invention, the device 50 is capable of performing in any of three modes. These operating modes are shown in Table 1 below. In the first mode, corresponding to both the active mode and the standby mode of operation for the pseudo SRAM device 50, the refresh controller 72 refreshes all of the blocks within the memory array 68. The second mode is the partial data retention mode of operation where the refresh controller 72 refreshes only selected blocks within the memory array 68. The third mode is a deep power down (DPD) mode where the refresh controller 60 is disabled and, therefore, does not refresh any of the blocks within the memory array 68.

TABLE 1

Operating Modes and Refresh Operation of Pseudo SRAM.

| Pseudo SRAM Operating Mode | Refresh Operation |
|---|---|
| Active and Standby | All Blocks Refreshed |
| Partial Data Retention (PDR) | Selected Blocks Refreshed |
| Deep Power Down (DPD) | No Blocks Refreshed |

The pseudo SRAM 50 operating mode is controlled using available control signals that are compatible with the SRAM standard operation. A single control signal is needed to perform selection between a full refresh state and a partial refresh state. More preferably, however, the device 50 operates in one of four modes: active, standby, PDR, and DPD. To select between these modes, two control signals are needed. In the preferred embodiment, the CSB signal and the ZZB signal are used. There are two preferred ways of defining the state table for a four mode functionality that are consistent with the operation of the prior art SRAM while adding the partial data retention function. A first state table for operating modes is shown below in Table 2.

TABLE 2

First State Table for Operating Modes.

| Operating Mode | CSB | ZZB |
|---|---|---|
| Active | 0 | 1 |
| Standby | 1 | 1 |
| Partial Data Retention | 0 | 0 |
| Deep Power Down | 1 | 0 |

An alternative state table is shown below in Table 3.

TABLE 3

Alternative State Table for Operating Modes.

| Operating Mode | CSB | ZZB |
|---|---|---|
| Active | 0 | 1 |
| Standby | 1 | 1 |
| Partial Data Retention | 1 | 0 |
| Deep Power Down | 0 | 0 |

Referring again to FIG. 2, in the active mode, the pseudo SRAM device 50 is enabled for read/write activity. The refresh controller 72 refreshes all of the blocks within the dynamic array 68. In the standby mode, the device 50 is not enabled for R/W, but full refresh of the array 68 continues. The partial data retention (PDR) mode is selected to reduce current consumption by the device 50 by reducing the amount of refresh that must occur while still maintaining a working section of dynamic memory. Data access (read/write) is disabled during PDR mode. Finally, the deep power down (DPD) mode is selected when it is not necessary to maintain any of the memory states and when minimum current drain is needed. Data access (read/write) is disabled during PDR mode. The addition of the PDR mode to a pseudo SRAM is a most important feature of the present invention and represents a valuable capability. The novel feature allows a low-cost, dynamic-only pseudo SRAM with a low power, data retention mode. In addition, the combination of the PDR mode with the DPD mode allows the device to work at normal power, full data retention; low power, partial data retention; and very low power, no data retention.

Referring again to FIG. 2, operating mode selection, which is shown in Tables 2 and 3, is preferably controlled by the mode select block 64. The mode select block 64 uses the CSB and ZZB inputs to enable the refresh operating modes described above. A partial data retention (PDR) mode configuration register is included in the preferred embodiment. The PDR CONFIG REG 76 allows specific blocks of the dynamic memory array 68 to be selected for refresh during PDR mode. Alternatively, the PDR refresh blocks could be hard-coded into the design.

Figure 3:
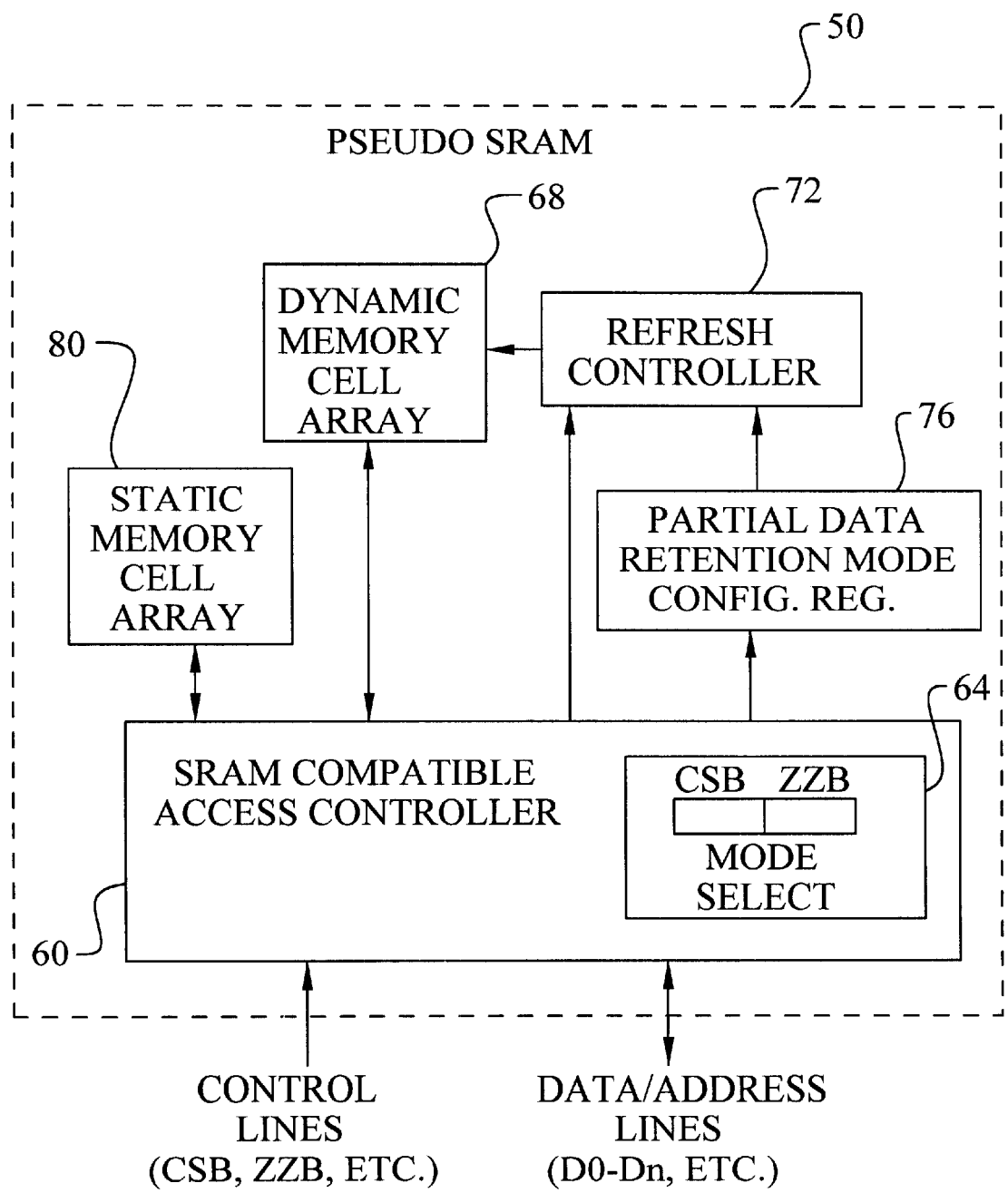
FIG. 3 illustrates the preferred embodiment with a static memory cell array added to the device to form a combination, pseudo SRAM device.

Referring now to FIG. 3, an alternative embodiment is shown. In this pseudo SRAM 50, a static memory array 80 is added to form a combination, pseudo SRAM device 50. This approach adds some measure of data retention (in the static array) to the deep power down (DPD) mode. The addition of the partial data retention (PDR) mode to the combination pseudo SRAM adds a significant additional flexibility of usage.

The advantages of the present invention may now be summarized. An effective and very manufacturable pseudo SRAM circuit is achieved. The pseudo SRAM circuit comprises a SRAM compatible access controller and a dynamic memory array where the standby current consumption is reduced. The standby current consumption of the pseudo SRAM device is reduced while providing partial data retention capability in the dynamic cell array. Increased flexibility of power save moding is achieved with partial data retention and no data retention options. Finally, the circuit is compatible with a dynamic memory only or with a mixed, dynamic and static memory.

As shown in the preferred embodiments, the novel pseudo SRAM circuit with partial data retention capability provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A pseudo SRAM integrated circuit device comprising:
   a memory array comprising a plurality of dynamic storage cells; and
   an access controller wherein said access controller provides read and write access to said memory array from an external device, wherein said access controller performance is compatible with a standard SRAM memory device, and wherein said access controller enables a partial data retention mode comprising selective refreshing of at least one part of said memory array and non-refreshing of at least one other part of said memory array.

2. The device according to claim 1 wherein said dynamic storage cells comprise single transistor cells.

3. The device according to claim 1 wherein said read and write access is disabled during said partial data retention mode.

4. The device according to claim 1 wherein said partial data retention mode is enabled and is disabled based on the state of at least one control signal of said access controller.

5. The device according to claim 1 wherein said access controller is further capable of a deep power down mode wherein refreshing of said memory array is disabled.

6. The device according to claim 5 wherein said partial data retention mode and said deep power down mode are selected between based on the state of two control signals of said access controller.

7. The device according to claim 1 further comprising a static memory array comprising static memory cells wherein said access controller provides read and write access to said static memory array from an external device.

8. The device according to claim 1 further comprising a means to externally configure said selective refreshing of at least one part of said memory array and non-refreshing of at least one other part of said memory array.

9. A pseudo SRAM integrated circuit device comprising:
   a memory array comprising dynamic storage cells; and
   an access controller wherein said access controller provides read and write access to said memory array from an external device, wherein said access controller performance is compatible with a standard SRAM memory device, wherein said access controller enables a partial data retention mode comprising selective refreshing of at least one part of said memory array and non-refreshing of at least one other part of said memory array, and wherein said partial data retention mode is enabled and is disabled based on the state of at least one control signal of said access controller.

10. The device according to claim 9 wherein said dynamic storage cells comprise single transistor cells.

11. The device according to claim 9 wherein said read and write access is disabled during said partial data retention mode.

12. The device according to claim 9 wherein said access controller is further capable of a deep power down mode wherein refreshing of said memory array is disabled.

13. The device according to claim 12 wherein said partial data retention mode and said deep power down mode are selected between based on the state of two control signals of said access controller.

14. The device according to claim 9 further comprising a static memory array comprising static memory cells wherein said access controller provides read and write access to said static memory array from an external device.

15. The device according to claim 9 further comprising a means to externally configure said selective refreshing of at least one part of said memory array and non-refreshing of at least one other part of said memory array.

16. A pseudo SRAM integrated circuit device comprising:
   a memory array comprising dynamic storage cells; and
   an access controller wherein said access controller provides read and write access to said memory array from an external device, wherein said access controller performance is compatible with a standard SRAM memory device, wherein said access controller enables a partial data retention mode comprising selective refreshing of at least one part of said memory array and non-refreshing of at least one other part of said memory array, wherein said access controller enables a deep power down mode wherein refreshing is disabled on said memory array, and wherein said partial data retention mode and said deep power down mode are selected between based on th e stat e of two control signals of said access controller.

17. The device according to claim 16 wherein said dynamic storage cells comprise single transistor cells.

18. The device according to claim 16 wherein said read and write access is disabled during said partial data retention mode.

19. The device according to claim 16 further comprising a static memory array comprising static memory cells wherein said access controller provides read and write access to said static memory array from an external device.

20. The device according to claim 16 further comprising a means to externally configure said selective refreshing of at least one part of said memory array and non-refreshing of at least one other part of said memory array.

* * * * *